(12) United States Patent
Roth et al.

(10) Patent No.: US 10,679,978 B2
(45) Date of Patent: Jun. 9, 2020

(54) CHIP MODULE WITH SPATIALLY LIMITED THERMALLY CONDUCTIVE MOUNTING BODY

(71) Applicant: Infineon Technologies AG, Neubiberg (DE)

(72) Inventors: Alexander Roth, Zeitlarn (DE); Juergen Hoegerl, Regensburg (DE); Hans-Joachim Schulze, Taufkirchen (DE); Hans-Joerg Timme, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/952,282

(22) Filed: Apr. 13, 2018

(65) Prior Publication Data

US 2018/0301444 A1 Oct. 18, 2018

(30) Foreign Application Priority Data

Apr. 13, 2017 (DE) .......... 10 2017 108 114

(51) Int. Cl.
| | | |
|---|---|---|
| *H01L 25/00* | (2006.01) | |
| *H01L 23/14* | (2006.01) | |

(Continued)

(52) U.S. Cl.
CPC .......... *H01L 25/50* (2013.01); *H01L 21/4807* (2013.01); *H01L 21/4825* (2013.01);

(Continued)

(58) Field of Classification Search
CPC ................ H01L 25/50; H01L 23/3735; H01L 23/49811; H01L 25/18; H01L 23/4952;

(Continued)

(56) References Cited

U.S. PATENT DOCUMENTS 4,858,077 A * 8/1989 Shinohara ........... H01L 23/4332
361/784
7,151,311 B2 12/2006 Nakajima et al.

(Continued)

FOREIGN PATENT DOCUMENTS

| CN | 103000590 | 3/2013 |
| DE | 39 31 634 | 4/1991 |

(Continued)

*Primary Examiner* — Bo Fan
(74) *Attorney, Agent, or Firm* — Dicke, Billig & Czaja, PLLC

(57) ABSTRACT

A module is disclosed. In one example, the module includes a carrier, an at least partially thermally conductive and electrically insulating body mounted on only a part of a main surface of the carrier, an at least partially electrically conductive redistribution structure on the thermally conductive and electrically insulating body, an electronic chip mounted on the redistribution structure and above the thermally conductive and electrically insulating body, and an encapsulant encapsulating at least part of the carrier, at least part of the thermally conductive and electrically insulating body, at least part of the redistribution structure, and at least part of the electronic chip.

15 Claims, 5 Drawing Sheets

(51) Int. Cl.
*H01L 23/373* (2006.01)
*H01L 21/48* (2006.01)
*H01L 25/18* (2006.01)
*H01L 23/495* (2006.01)
*H01L 21/56* (2006.01)
*H01L 25/16* (2006.01)
*H01L 23/498* (2006.01)
*H01L 23/31* (2006.01)

(52) U.S. Cl.
CPC ........ *H01L 21/4839* (2013.01); *H01L 21/565* (2013.01); *H01L 23/142* (2013.01); *H01L 23/3731* (2013.01); *H01L 23/3735* (2013.01); *H01L 23/4952* (2013.01); *H01L 23/49537* (2013.01); *H01L 23/49575* (2013.01); *H01L 23/49811* (2013.01); *H01L 25/16* (2013.01); *H01L 25/18* (2013.01); *H01L 23/3107* (2013.01); *H01L 2224/0603* (2013.01); *H01L 2224/48139* (2013.01); *H01L 2224/49111* (2013.01)

(58) Field of Classification Search
CPC ............. H01L 21/4825; H01L 21/4839; H01L 23/3731; H01L 25/16; H01L 21/565; H01L 21/4807; H01L 23/142; H01L 23/49575; H01L 23/49537; H01L 2224/48139; H01L 2224/0603; H01L 2224/49111; H01L 23/3107

USPC .......................................................... 257/668
See application file for complete search history.

(56) References Cited

U.S. PATENT DOCUMENTS

| | | | |
|---|---|---|---|
| 7,589,412 B2 | 9/2009 | Kashimoto et al. | |
| 7,902,660 B1* | 3/2011 | Lee | H01L 21/4857 257/698 |
| 8,030,749 B2 | 10/2011 | Soyano et al. | |
| 8,390,107 B2* | 3/2013 | Meyer | H01L 21/561 257/684 |
| 8,436,459 B2 | 5/2013 | Oka et al. | |
| 2013/0337613 A1* | 12/2013 | Kim | H01L 23/4334 438/123 |
| 2015/0155267 A1* | 6/2015 | Hoegerl | H01L 25/0655 257/698 |
| 2016/0260648 A1 | 9/2016 | Eisele | |
| 2017/0069569 A1 | 3/2017 | Matsuyama | |
| 2017/0133291 A1 | 5/2017 | Eisele et al. | |
| 2017/0365541 A1 | 12/2017 | Eisele et al. | |

FOREIGN PATENT DOCUMENTS

| | | |
|---|---|---|
| DE | 10 2006 051 454 | 9/2007 |
| DE | 10 2008 060 300 | 6/2009 |
| DE | 10 2009 044 659 | 7/2010 |
| JP | S60226149 | 11/1985 |
| WO | 2010/081465 | 7/2010 |

\* cited by examiner

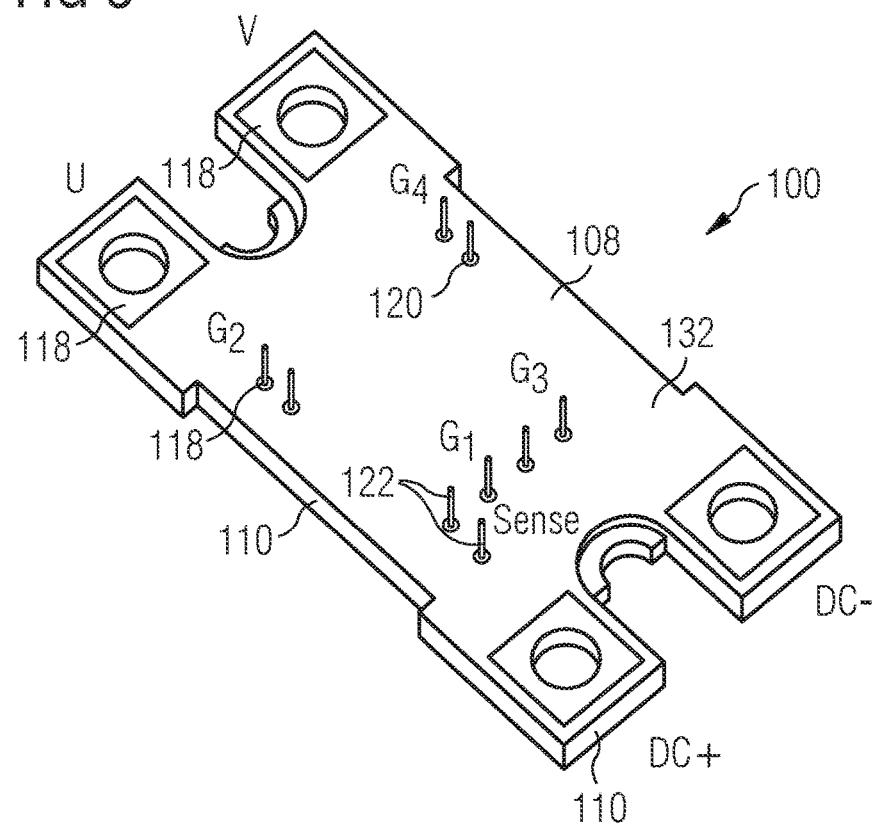
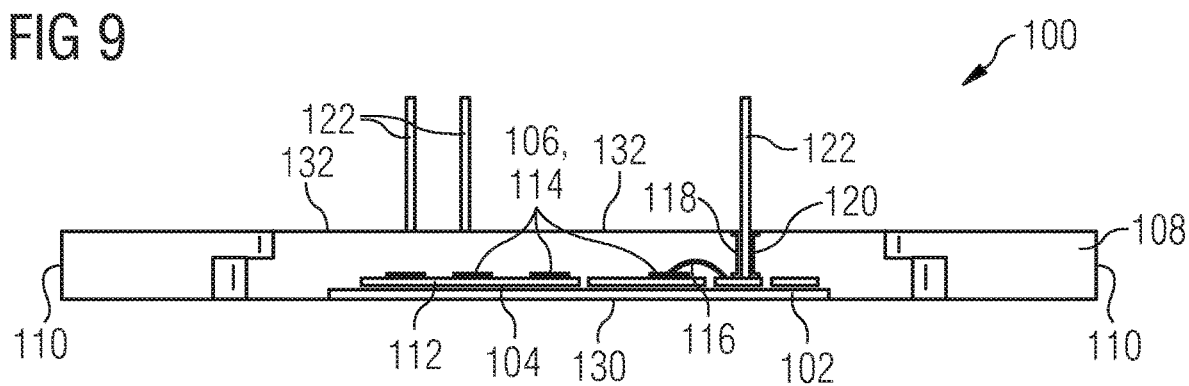

CHIP MODULE WITH SPATIALLY LIMITED THERMALLY CONDUCTIVE MOUNTING BODY

CROSS-REFERENCE TO RELATED APPLICATION

This Utility Patent Application claims priority to German Patent Application No. 10 2017 108 114.3, filed Apr. 13, 2017, which is incorporated herein by reference.

BACKGROUND OF THE INVENTION

The present invention relates to modules, and a method of manufacturing a module.

Conventional encapsulant materials, such as mold structures, for electronic components and in particular electronic chips have evolved to a level where the package no longer significantly impedes the performance of the components. Encapsulating electronic components during package manufacture may protect them against the environment.

However, there is still potentially room to reduce manufacturing cost and simplify processing while maintaining a high heat removal capability of removing heat generated during operation of the package.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 8 shows a three-dimensional view of a power module manufactured by executing the method described referring to FIG. 1 to FIG. 7 according to an exemplary embodiment.

FIG. 9 shows a cross-sectional view of a power module according to an exemplary embodiment.

DETAILED DESCRIPTION OF EXEMPLARY EMBODIMENTS

Figure 1:
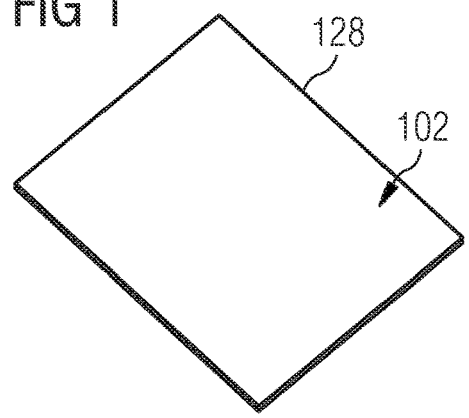
FIG. 1 to FIG. 7 show three-dimensional views of intermediate structures obtained during carrying out a method of manufacturing a power module according to an exemplary embodiment.

There may be a need for a mechanically and electrically reliable module which can be manufactured with low effort while ensuring an efficient heat removal during operation.

According to an exemplary embodiment, a module is provided which comprises a carrier, an at least partially thermally conductive and electrically insulating body mounted on only a part of a main surface of the carrier, an at least partially electrically conductive redistribution structure on the thermally conductive and electrically insulating body, an electronic chip mounted on the redistribution structure and above the thermally conductive and electrically insulating body, and an encapsulant encapsulating at least part of the carrier, at least part of the thermally conductive and electrically insulating body, at least part of the redistribution structure, and at least part of the electronic chip.

According to another exemplary embodiment, a power module is provided which comprises a plate-type carrier, a plurality of plate-type thermally conductive and electrically insulating bodies mounted on a main surface of the carrier, a semiconductor power chip and a component each mounted on or above a respective one of the thermally conductive and electrically insulating bodies, and a mold-type encapsulant encapsulating at least part of the carrier, at least part of the thermally conductive and electrically insulating bodies, at least part of the semiconductor power chip and at least part of the component.

According to yet another exemplary embodiment, a method of manufacturing a module is provided which comprises mounting a thermally conductive and electrically insulating body on only a part of a main surface of a carrier, mounting an at least partially electrically conductive redistribution structure on the thermally conductive and electrically insulating body, mounting an electronic chip on the redistribution structure and above the thermally conductive and electrically insulating body, and encapsulating at least part of the carrier, at least part of the thermally conductive and electrically insulating body, at least part of the redistribution structure, and at least part of the electronic chip by an encapsulant.

According to an exemplary embodiment, a module is provided in which one or more expensive highly thermally conductive and electrically insulating bodies can be provided each with a very small dimension, thereby allowing manufacturing of the module or package with low effort. According to such an embodiment, the respective thermally conductive and electrically insulating body covers only a sub-portion of one main surface of a carrier rather than substantially entirely covering it. Position and dimension of the respective thermally conductive and electrically insulating body on the carrier may be specifically selected to correspond to a position and dimension of an electronic chip or component acting as heat source during operation of the module. More specifically, the respective electronic chip or electronic component may be mounted directly vertically above the thermally conductive and electrically insulating body and thus with a very small distance thereto. As a result, in a vertical projection, the chip or component may be aligned or may be in flush with a portion of the respective body. However, in surface portions of the carrier which are not covered by a thermally conductive and electrically insulating body, there are preferably no chips or components present in a vertical projection or view. A cheap encapsulant may then fill remaining gaps within the module by encapsulating the mentioned constituents of the module substantially without leaving void spaces within the module. During operation of the module, the thermally conductive and electrically insulating body/bodies may efficiently contribute to the heat removal from heat source(s) in form of the one or more electronic chips and/or the one or more components of the package. Due to the described geometric arrangement of the thermally conductive and electrically insulating body or bodies spatially very close to and limited to the regions of pronounced heat generation, such heat may be efficiently dissipated and spread from the heat source via the body and the carrier to an exterior of the module. Since the material of the one or more thermally conductive and electrically insulating body or bodies is dielectric, its selective presence in regions of high electric field strength simultaneously also ensures a high electric performance of the module. A redistribution structure sandwiched between the body/bodies and the chip/component may efficiently organize an electric coupling of chip/component with an exterior of the module.

In the context of the present application, the term "electronic chip" may particularly denote a chip (more particularly a semiconductor chip) providing an electronic function. The electronic chip may be an active electronic component. In one embodiment, the electronic chip is configured as a controller chip, a processor chip, a memory chip, a sensor chip or a micro-electromechanical system (MEMS). In an alternative embodiment, it is also possible that the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

In the context of the present application, the term "component" may particularly denote any electronic member which fulfils an electronic function in the package when mounted on the carrier. In particular, the component may be embodied as a passive component such as a capacitance, an inductance or an ohmic resistance. It is however also possible that the component is an active component.

In the following, further exemplary embodiments of the modules and the method will be explained.

In an embodiment, the thermally conductive and electrically insulating body is made of a material having a thermal conductivity of at least 20 W/mK. For example, the thermal conductivity of the thermally conductive and electrically insulating body may be in a range between 20 W/mK and 200 W/mK.

In alternative embodiments, the thermally conductive and electrically insulating body is made of a material having a thermal conductivity less than 20 W/mK in conjunction with a thickness of less than 150 μm.

For example, the thermal conductivity of the thermally conductive and electrically insulating body may be in a range between 20 W/mK and 150 W/mK, and may comprise or consist of a ceramic polymer matrix. For instance, the thickness of the thermally conductive and electrically insulating body may be in a range between 20 μm and 150 μm, in particular when comprising or consisting of a ceramic polymer matrix.

In an embodiment, the encapsulant forms at least part of a lateral sidewall of the module, preferably forms the entire sidewall of the module. Correspondingly, a side surface of the module may be partially or completely formed by the encapsulant. The encapsulant may hereby not only form part of an upper main surface of the module, but may also constitute at least part of the sidewalls. Thereby, a separate member forming sidewalls of the package may be omitted, so that the module can be manufactured in a compact and simple way.

In an embodiment, at least 5%, in particular at least 20%, more particularly at least 50%, of an area of a main surface of the carrier facing the thermally conductive and electrically insulating body (or multiple thermally conductive and electrically insulating bodies) remain free of the thermally conductive and electrically insulating body or bodies. Thus, a substantial surface portion of the carrier may remain exposed and uncovered by the expensive thermally conductive and electrically insulating material of the one or more thermally conductive and electrically insulating bodies. By taking this measure, the costly thermally conductive and electrically insulating material may be limited specifically to those portions where a significant amount of heat is generated and a high electric field strength is present during operation of the package, i.e. directly beneath the one or more electronic chips/components.

In an embodiment, the electronic chip is configured as a power chip and the module is configured as a power module. Since both the heat removal capability and the electric robustness of the module are of high performance due to the combination of the thermally conductive and electrically insulating body on the one hand as well as the carrier on the other hand, it is possible to implement electronic chips in the module which are power semiconductor chips, i.e. generate significant amount of heat during operation and may operate with high current values. In view of the enabled heat removal, heat spreading and electrical robustness, it is thus possible to manufacture the module with high reliability even when high current and high electric power is present in the one or more semiconductor power chips.

In an embodiment, the carrier is configured as a carrier plate. Such a carrier plate may form substantially an entire lower main surface of the module and may thereby allow for a high performance heat removal. Thus, the carrier may not only serve as a mounting base for the thermally conductive and electrically insulating body/bodies on one main surface thereof, but may also form—at an opposing other main carrier surface—an exterior surface of the module or package which contributes to the heat removal.

In an embodiment, the carrier is made of a thermally conductive and electrically conductive material such as a metal (for instance copper or aluminium). For instance, the carrier may hence be embodied as a metal plate, in particular a copper plate or an aluminium plate. By taking this measure, the module may be manufactured with very low effort and costs and nevertheless guarantees an efficient heat removal.

In an embodiment, the carrier forms part of an exterior surface of the module, in particular substantially forms one main surface of the module. By taking this measure, heat removal via the carrier may be carried out over a large dimension and hence very efficiently. This renders the module reliable even in applications involving significant amount of heat, for instance power semiconductor applications.

Preferably, the carrier may be a metal plate. Alternative carriers which may be used for other embodiments can be a substrate, an IMS (Insulated Metal Substrate), a PCB (printed circuit board), etc.

In an embodiment, the encapsulant comprises at least one of the group consisting of a mold compound and a laminate. In a preferred embodiment, the encapsulant is a mold compound. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity may be embedded in an epoxy-based matrix of the encapsulant.

In an embodiment, the encapsulant forms at least part of (for instance at least 70% or at least 80% of) one main surface of the module. In particular, the encapsulant may form an upper main surface substantially entirely (for instance only some small electric contacts may be provided at this main surface apart from the encapsulant), while a lower main surface of the module may be substantially formed by the carrier. Thereby, the encapsulant may form the sidewall and may form at least part of an upper main surface of the module and may thus contribute significantly to a definition or delimitation of the outline of the module. This renders additional members defining such an outline dispensable. As a consequence, a highly compact and simply manufacturable module may be obtained.

In an embodiment, the module comprises an at least partially electrically conductive redistribution structure between the thermally conductive and electrically insulating body on the one hand and the electronic chip/component on the other hand. Such a (for instance metallic) redistribution structure may be sandwiched vertically between the electronic chip(s)/component(s) and the thermally conductive and electrically insulating body/bodies and may function as an electric signal distribution member. While the at least one thermally conductive and electrically insulating body assures an electric isolation between an exterior surface of the module on the one hand and the one or more electronic chips/components on the other hand, the redistribution structure fulfils the electronic redistribution function of the module. The redistribution structure may be embedded in the encapsulant and may be connected to internal and/or external electrically conductive contact structures to enable an electric communication between an interior of the module and an electronic periphery of the module.

In an embodiment, the redistribution structure is configured as one or more redistribution plates, in particular one or more patterned redistribution plates. For instance, such a redistribution plate may be a punched or etched metal plate such as a copper plate. By taking this measure, management of the signal supply from and to the one or more electronic chips/components in an interior of the module can be realized by the redistribution structure with low effort and high flexibility for a circuit designer. Moreover, the plate-like configuration of the redistribution structure ensures a compact design of the module.

In an embodiment, the redistribution structure comprises at least two redistribution elements being at least partially vertically spaced. Preferably, the redistribution structure may be configured so that, during operation of the package, current flow paths through the vertically spaced redistribution elements or sections may be antiparallel. As a consequence of the described multi-level design of the redistribution structure, the parasitic inductance of the redistribution structure can be rendered advantageously very small.

In an embodiment, the redistribution structure extends completely inside the encapsulant where the redistribution structure may be electrically coupled with electrically conductive contact structures. The redistribution structure in an interior of the encapsulant may be electrically connected with one or more electronic chips/components via internal electrically conductive contact structures. External electrically conductive contact structures extending beyond the encapsulant may be electrically coupled, in turn, with the redistribution structure.

In an embodiment, the redistribution structure is substantially X-shaped with a central plate portion. With an X-shape of the redistribution structure, it is possible to spatially separate the external contacts of the module so as to be compatible with a larger dimensioned electronic environment. For instance, electric power connections of the module may be formed at the four ends of the X-shaped structure. On the other hand, the tapering geometry of the redistribution structure in the central plate portion of the substantially X-shaped redistribution structure allows to mount the electronic chips/components in a compact way.

In an embodiment, the thermally conductive and electrically insulating body is made of a ceramic material, for instance may consist of ceramic material. A highly thermally conductive ceramic may for instance be made of silicon nitride, aluminium nitride, etc. Also a Direct Copper Bonding (DCB) substrate, a Direct Aluminum Bonding (DAB) substrate, etc., may be used as thermally conductive and electrically insulating body.

In an embodiment, the module comprises at least one further thermally conductive and electrically insulating body mounted on only another part of the main surface of the carrier. The further thermally conductive and electrically insulating body may be spaced from the first mentioned thermally conductive and electrically insulating body so that a portion of the module internal main surface of the carrier remains free of highly thermally conductive and electrically insulating material. The module may additionally comprise a component, in particular a further electronic chip, mounted on the redistribution structure and above the further thermally conductive and electrically insulating body. According to such an embodiment, multiple thermally conductive and electrically insulating bodies may be mounted on one and the same carrier, preferably all carrying the above-described redistribution structure. Thus, the presence of thermally conductive and electrically insulating bodies may be limited to portions of the module where they are really needed in view of their dielectric function and their function of efficiently removing heat from the electronic chips/components to an exterior of the module. Rather than providing one large thermally conductive and electrically insulating body extending over the entire surface of the carrier or forming a substantial portion of an interior main surface of the module, the multiple thermally conductive and electrically insulating bodies may be provided with strictly limited dimensions corresponding to mounting positions of the multiple electronic chips/components. Rather than being embodied as a further electronic chip (for instance as a further semiconductor power chip), the mentioned component may also be a passive electronic member such as a capacitor or the like.

In an embodiment, the module comprises at least one internal electrically conductive contact structure (preferably fully) encapsulated by the encapsulant, in particular at least one of a bond wire and a bond ribbon. The internal electrically conductive contact structure may connect the at least one electronic chip with the redistribution structure, and/or the at least one electronic chip with the at least one component. The internal electrically conductive contact structure may also connect the at least one component with the redistribution structure. Moreover, the internal electrically conductive contact structure may connect multiple electronic chip with one another and/or multiple components with one another. Such an internal electrically conductive contact structure, which preferably does not extend up to the surface of the package, may for instance be embodied as bond wires and/or bond ribbons interconnecting the interior of the module. The formation of the internal electrically conductive contact structures may be accomplished prior to encapsulation and after mounting the one or more electronic chips and the one or more electronic components on the redistribution structure.

In an embodiment, the module comprises at least one external electrically conductive contact structure extending beyond the encapsulant and electrically connecting the electronic chip and/or the component with an electronic environment. The one or more external electrically conductive contact structures may be electrically conductive bodies attached to the redistribution structure so as to form electric contacts extending beyond the encapsulant up to an exterior of the module. They may also be connected to the electronic chip(s), the component(s), etc. By such contacts, electric signals may be supplied to the one or more electronic chips/components or may be guided out of the package from the one or more electronic chips and/or components.

In an embodiment, the at least one external electrically conductive contact structure comprises at least one electrically conductive sleeve having a hollow space configured for accommodating an electrically conductive pin. The sleeve may be embedded in the encapsulant and may contact the electronic chips and/or redistribution structure. When preventing encapsulant material to flow into the hollow spaces of the sleeves (for instance by foil molding), it is possible to later simple insert electrically conductive pins in the hollow sleeves after encapsulation to thereby obtain external pin contacts with low effort. Such sleeve-pin arrangements may serve as signal connections carrying signals during operation of the module. In contrast to this, electric power may be transported to the one or more chips/components via one or more other external electrically conductive contact structures. The latter may be embodied as bulky conductors attaches to free ends of a substantially X-shaped redistribution structure.

In an embodiment, the method comprises mounting the thermally conductive and electrically insulating body/bodies on the carrier by soldering. However, as an alternative to soldering, it is also possible to accomplish the connection by sintering, gluing, etc.

In an embodiment, the method comprises mounting the one or more electronic chips/components on the redistribution structure by soldering. Also this soldering connection between electronic chip and thermally conductive and electrically insulating body may be alternatively realized by sintering or electrically conductive gluing.

In an embodiment, the method comprises forming the above mentioned at least one external electrically conductive contact structure electrically on the redistribution structure for connecting the electronic chip with an electronic environment, and subsequently only partially encapsulating the at least one external electrically conductive contact structure so as to extend beyond the encapsulant by foil molding. By foil molding, it can be ensured that the one or more external electrically conductive contact structures are safely prevented from being covered with electrically insulating encapsulation material. This would render the one or more external electrically conductive contact structures incapable of fulfilling their electronic contacting function of the electronic chip/component with regard to an electronic periphery of the module. In order to achieve this, one or more (for instance adhesive) foils may be put on the portions of the external electrically conductive contact structures which shall remain free of encapsulant material during encapsulation. After encapsulation, the foils may again be removed from the external electrically conductive contact structures which therefore remain uncovered by encapsulant material.

In embodiments, the module or package may be configured as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the module or package is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the package according to an exemplary embodiment is fully compatible with standard packaging concepts (in particular fully compatible with standard TO packaging concepts) and appears externally as a conventional electronic component, which is highly user-convenient. In an embodiment, the package is configured as power module, e.g. molded power module. For instance, an exemplary embodiment of the electronic component may be an intelligent power module (IPM).

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology. A semiconductor device according to an exemplary embodiment may be configured as micro-electromechanical system (MEMS), sensor, etc.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

The illustration in the drawing is schematically.

Before describing further exemplary embodiments in further detail, some basic considerations of the present inventors will be summarized based on which exemplary embodiments have been developed.

In order to manufacture a module or package of an exemplary embodiment compact and with low effort without compromising on electric and thermal reliability, it is possible to provide a low-dimensioned highly thermally conductive and electrically insulating body (for instance comprising or consisting of silicon nitride) limited to high performance regions of the module to improve heat removal capability and electric performance of the module. In order to keep the effort for manufacturing the package very low, it is possible to limit the provision of the at least one highly thermally conductive and electrically insulating body to a spatial region of the module where this is in fact needed (i.e. regions with high thermal load and experiencing high electric field strength).

In accordance with the foregoing, an exemplary embodiment provides a module in which module frame, encapsulation and filling of voids around a minimum substrate (i.e. the one or more thermally conductive and electrically insulating bodies) can be performed in one single common procedure. Only in regions of highest performance or power density (in particular below one or more electronic chips and/or electronic components, preferably exclusively there), a thermally high performance thermally conductive and electrically insulating body (in particular made of a ceramic) is implemented. Remaining voids of the module may be filled with low-cost material, in particular a mold compound or another encapsulant.

By taking the described measures, it is possible to manufacture a highly efficient, compact and easily manufacturable power semiconductor module. By reduction of the implementation of a ceramic to one or more regions of highest power density, it is also possible to employ manufacturing procedures such as laser sintering for the thermally conductive and electrically insulating body or bodies. Moreover, the use of an encapsulant such as a mold compound reduces the complexity of the manufacturing procedure and keeps the number of constituents of the module small.

In an embodiment, a (for instance DCB (Direct Copper Bonding) or IMS (intermetallic substrate) free) module may be provided with a minimum sized or at least spatially restricted thermally conductive and electrically insulating body. The one or more highly thermally conductive and electrically insulating bodies may be provided exclusively in regions beneath the one or more electronic chips and/or electronic components. Hence, the thermally conductive and electrically insulating body may be provided smaller, in particular significantly smaller, than the upper and lower main surface of the module. Nevertheless, the entire main surfaces of the module may be used for electric redistribution and heat spreading. Regions between the layers (including a redistribution structure and plate-type carrier) may be filled up with an encapsulant such as an epoxy resin based mold compound. The encapsulation may thereby define a significant portion of the outline of the manufactured module. This again renders the provision of separate outline defining components dispensable. The manufacture of module frame, encapsulant and filling of voids around the minimum substrate (i.e. the one or more thermally conductive and electrically insulating bodies) may be done in one common simple manufacturing process and in a compact way.

Moreover, a carrier (such as a carrier plate or a carrier shaped in another way) may be defined as an integral constituent of the module, i.e. forming part of the layer stack. Thereby, the need of a separate bottom plate can be eliminated as compared to conventional module architectures.

In an embodiment, it is also possible to configure parts (such as layers or plate sections) of the redistribution structure in a three-dimensionally shaped manner so that different portions of the redistribution structure may be aligned vertically spaced (in particular parallel) to one another. By taking this measure, the parasitic inductance of the module can be reduced, which further improves the electrical performance of the module. Descriptively speaking, an electric current may be guided antiparallel through the different planes of the redistribution structure which reduces the net inductance.

According to an exemplary embodiment, a module (in particular without separate bottom plate) is provided which is based on a minimum substrate approach, i.e. has only a very small surface of a carrier covered by one or more thermally conductive and electrically insulating bodies. In an embodiment, a carrier substrate, a carrier frame and an encapsulant (which may be formed separately in a conventional approach) can be formed at least partially as a common structure.

FIG. 1 to FIG. 7 show three-dimensional views of intermediate structures obtained during carrying out a method of manufacturing a power module 100 according to an exemplary embodiment.

Referring to FIG. 1, a carrier 102 is illustrated which is used as a basis for manufacturing the module 100. In the shown embodiment, the carrier 102 is configured as an electrically conductive carrier plate, for instance made of a metal such as copper. Preferably, the material of the carrier 102 is thermally conductive so as to properly contribute to the heat removal out of the module 100 during operation. In the readily manufactured module 100, the carrier 102 forms part of an exterior surface of the module 100 and may even substantially form one main surface 130 of the module 100 (compare FIG. 9).

FIG. 1 therefore shows the carrier 102 as a bottom plate constituting an interface for the external cooling of the module 100 under manufacture. The carrier 102 can be manufactured as a planar copper plate. Another embodiment of the carrier 102 is an AlSiC plate which may be equipped with pin fins and sealing grooves at the bottom side. The module interior main surface 128 of the carrier 102 can be preferably made of a material being capable of being solder-connected with a thermally conductive and electrically insulating body 104 (see FIG. 2). Moreover, it is advantageous that the carrier 102 is made of a material providing a proper adhesion interface for a mold compound or another encapsulant 108. It is however also possible that the adhesion of a mold compound is promoted by a corresponding surface treatment of the carrier 102, for instance surface coating with an adhesion promoter.

Figure 2:
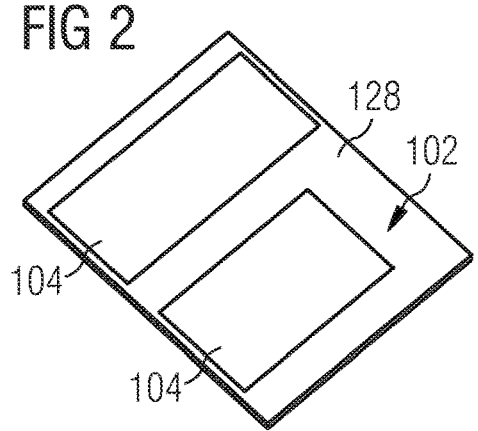

Referring to FIG. 2, a structure is shown in which two separate rectangular plate-type thermally conductive and electrically insulating bodies 104 have been mounted on only a respective part of a main surface 128 of a carrier 102 by soldering. Thus, a portion of the upper main surface 128 of the carrier 102 remains uncovered from the bodies 104. The uncovered portion may for instance be at least 10%, preferably more than 20% of the entire surface area of main surface 128.

The thermally conductive and electrically insulating bodies 104, which may also be denoted as isolation elements, can be mounted on the carrier 102 serving as integral bottom plate of the module 100 under manufacture. The bodies 104 also function as spacers. For instance, the bodies 104 may be made of a silicon nitride ceramic with a thermal conductivity of for example about 90 W/mK. It is however also possible to use $Al_2O_3$, AlN, BN, ZTA (Zirconia Toughened Alumina) ceramics or a ceramic/polymer composite material.

Shape and dimension of the isolation elements or bodies 104 may be adjusted on the basis of the following two criteria. A first criterion is to make the selection so that a mostly efficient use of the area is possible. A second criterion is that the dimensioning of the bodies 104 is selected so that they cover the most intense heat spreading region under electronic chips 106 and electronic components 114 to be mounted later (see FIG. 4). Furthermore, it is advantageous if the bodies 104 cover regions in which the mechanical force during the assembly process is high. Typically, these regions are the regions of wire bonding and/or regions of welding connection (see FIG. 5, FIG. 6). It is advantageous to keep the bodies 104 as small as possible to keep the effort for manufacturing the module 100 small.

It is however also possible to manufacture the bodies 102 in an additive way on the carrier 102. For instance, this may be done by depositing the corresponding material, for instance by three dimensional printing, stencil printing, screen-printing. It is also possible to apply in situ laser sintering or pressure assisted sintering at a temperature below the melting temperature of the copper material of the carrier 102. An advantage of the implementation of an additive material in this context is that this allows a design with higher degree of freedom and allows an improvement in terms of a large manufacturing area of a panel.

In the following, several embodiments for connecting the bodies 104 on the carrier 102, in particular the formation of a ceramic-metal connection, will be described.

In one corresponding embodiment, the isolation elements or bodies 104 are covered on both opposing main surfaces with a solder material, for instance a silver solder. Such a material can be applied by screen-printing and can be stabilized by a drying procedure to obtain a rubber-like consistence. By taking this measure, it is possible to cover also large panels which can be later singularized into individual modules or portions thereof. In such a state, the carrier 102, the bodies 104 and a redistribution structure 112 (see FIG. 3) can be connected by soldering in a vacuum oven at a temperature of 400° C. When adding a protection atmosphere or a reducing atmosphere, an undesired oxidation of the constituents of the module 100 or connecting materials may be prevented. Temperature robust guiding elements which may apply a pressure on the layer stack may prevent undesired sliding of the individual constituents. Thereby, a more reliable module 100 can be obtained. Also the formation of undesired voids or the like may be prevented. Subsequently, it is possible to chemically treat the obtained structure. On the one hand, it is possible to remove excessive solder material which can have accumulated as a result of the preceding procedures. In particular, it is thereby possible to keep sidewalls of the ceramic free of undesired solder material. It is additionally also possible to clean or purify the copper surface, roughen the copper surface and de-oxidize the copper surface in order to prepare the surface of the carrier 102 properly for an adhesion of a mold compound or other encapsulant 108 (see FIG. 7). Sensitive regions of the carrier 102 can be covered during this chemical preparation procedure, for instance using a mounting element in combination with a sealing lip.

As an alternative for the connection between carrier 102 and bodies 104, it is possible to use AlSi as solder. It is possible to substitute a silver solder by AlSi3-5.

A further alternative is to solder the bodies 104 with an AMB (active metal braze) solder (for instance having a silver content of larger than 30%, at a temperature of above 600° C.) on the copper carrier 102.

In yet another embodiment, it is possible to connect the ceramic material of the bodies 104 to the carrier 102 at a temperature above 1065° C. In this embodiment, it is possible to pre-oxidize the involved layers as oxygen carrying layers.

Figure 3:
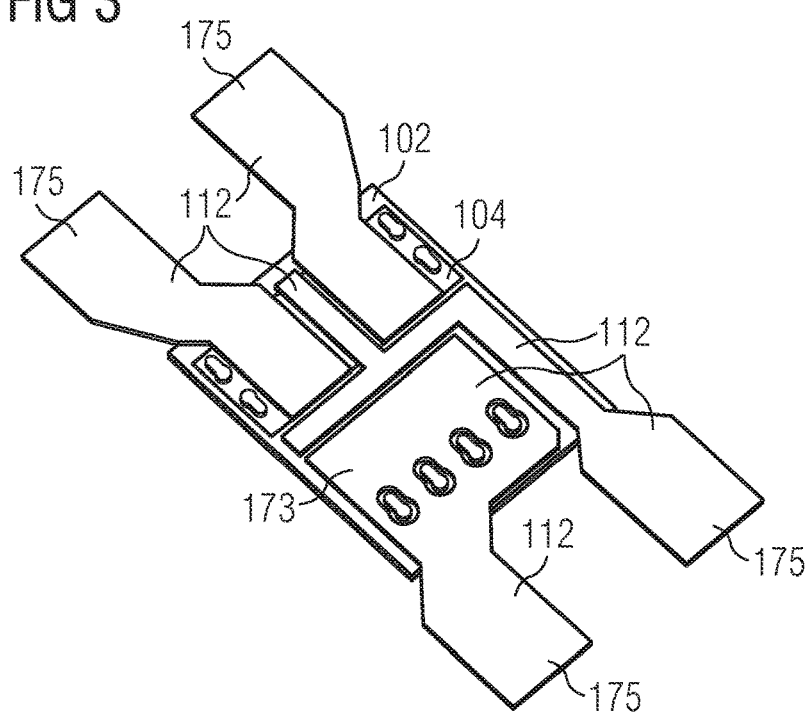

According to still another embodiment, it is possible to connect the polymer ceramic composite material of the bodies 104 by their polymer content direct on a roughened (in particular copper) carrier 102, for instance by lamination under pressure. Referring to FIG. 3, an electrically conductive redistribution structure 112 is mounted on the thermally conductive and electrically insulating bodies 104 and on the carrier 102, but laterally protruding beyond bodies 104 and carrier 102 in free end regions 175 of the redistribution structure 112. In the described embodiment, the redistribution structure 112 is configured as a patterned metallic redistribution plate. The redistribution structure 112 is substantially X-shaped with a central plate portion 173 from which the four free end regions 175 extend laterally outwardly. This central plate portion 173 of the redistribution structure 112 is mounted on the bodies 104 and the carrier 102, whereas the four end regions 175 of the redistribution structure 112 extend laterally beyond the carrier 102.

Referring to FIG. 3, the redistribution structure 112 may be placed on the isolation elements or bodies 104. For instance, the redistribution structure 112 can be a punched copper plate. During the mounting procedure, it is possible to connect later galvanically separated regions by a guiding frame to keep them in position.

The three before mentioned manufacturing procedures can be carried out at one manufacturing site.

Figure 4:
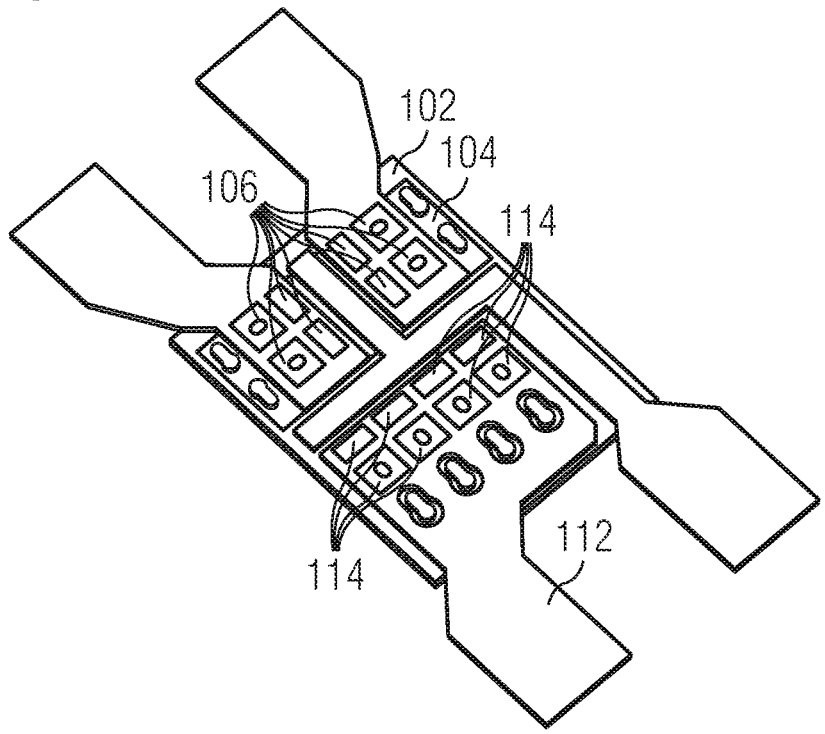

Referring to FIG. 4, multiple electronic chips 106 (such as active semiconductor chips) are mounted by soldering on the redistribution structure 112 and directly vertically above one of the thermally conductive and electrically insulating bodies 104. Moreover, a plurality of further electronic components 114 (such as passive components like capacitors) are mounted by soldering on the redistribution structure 112 and directly vertically above the other one of the thermally conductive and electrically insulating bodies 104. For example, the components 114 may be passive electronic components (such as temperature resistances, shunts, ohmic resistances, inductances or capacitances), may be glass chips for module tracing, or may be further electronic chips 106 (such as driver chips). More specifically, sizes and positions of the bodies 104 are specifically selected so as to correspond or to flush with the positions of the electronic chips 106 and of the components 114. As a result, the expensive highly thermally conductive bodies 104 need to be provided only at the positions of the heat generating electronic chips 106 and components 114 to thereby contribute to a heat spreading and heat removal during operation of the module 100. This position also corresponds to a position of maximum electric field strength, so that the bodies 104 also strengthen the electric robustness of the module 100. Thus, the described manufacturing architecture is particularly advantageous when the electronic chips 106 are configured as semiconductor power chips and the module 100 is configured as a power module. Such power semiconductor chips may comprise integrated circuit elements such as insulated gate bipolar transistors and/or diodes.

The mounting procedure of the electronic chips 106 and the components 114 may be accomplished by a soldering procedure. Other procedures such as sintering are possible as well.

Figure 5:
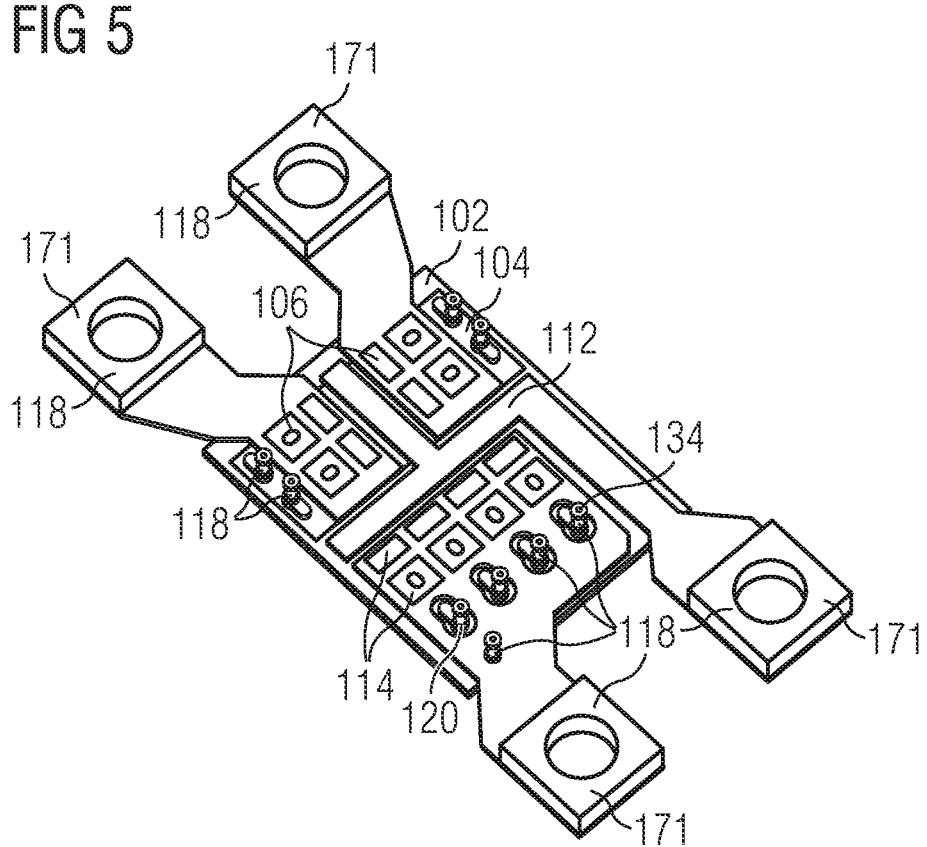

Referring to FIG. 5, external electrically conductive contact structures 118 are formed (extending beyond the later formed encapsulant 108 and) electrically connecting the electronic chips 106 and the components 114 with an electronic environment. The external electrically conductive contact structures 118 comprise electrically conductive sleeves 120 each having a hollow space 134 and being configured for accommodating an electrically conductive pin 122 (compare FIG. 8 and FIG. 9). The external electrically conductive contact structures 118 also comprise bulky connectors 171 attached onto the end regions 175 of the redistribution structure 112.

As can be taken from FIG. 5, the external electrically conductive contact structures 118 are formed on the redistribution structure 112. This can be carried out together with the mounting of the electronic chips 108 and the components 114 in the context of the described solder connection process. Alternatively, it is also possible to carry out the connection of the external electrically conductive contact structures 118 by ultrasonic welding. Other connection techniques are possible as well. For the signal connections, it is possible to use pin sleeves 120. For electrical load contacts, larger metal sleeves with threads or the bulky connectors 171 may be implemented.

Figure 6:
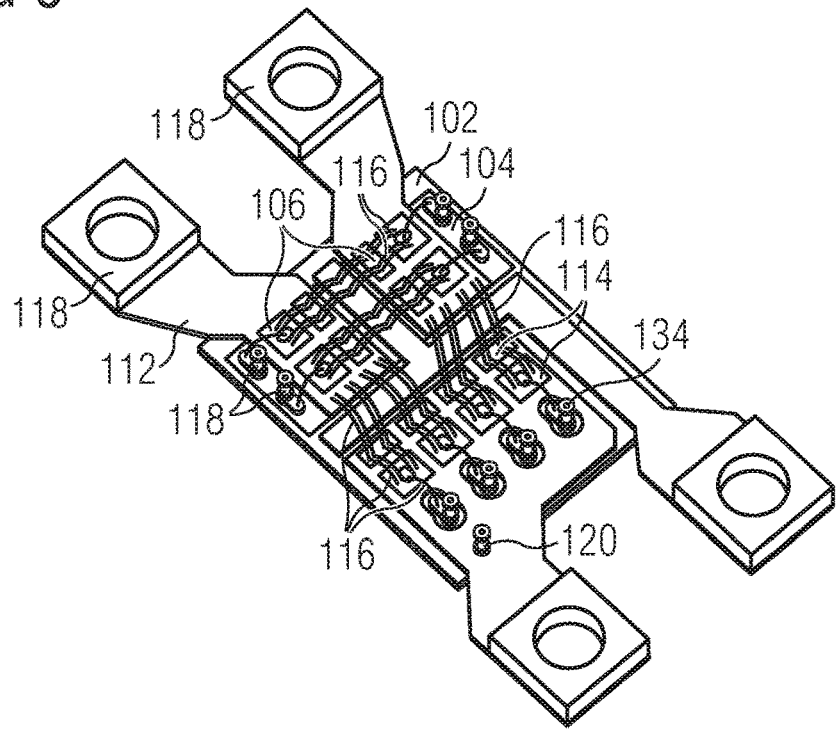

Referring to FIG. 6, internal electrically conductive contact structures 116 are formed (which are later completely encapsulated by the encapsulant 108). The internal electrically conductive contact structures 116 can be embodied as bond wires and/or bond ribbons electrically connecting the electronic chips 106, the components 114, and the redistribution structure 112 with one another. Thus, the electronic chips 106, the components 114, and the redistribution structure 112 may be connected by aluminium or copper wires with one another. Additionally or alternatively, ribbon bonds or sintered wire contacts may be implemented. When the external electrically conductive contact structures 118 are formed by ultrasonic welding, wire bonding can be carried out directly after chip mounting.

Figure 7:
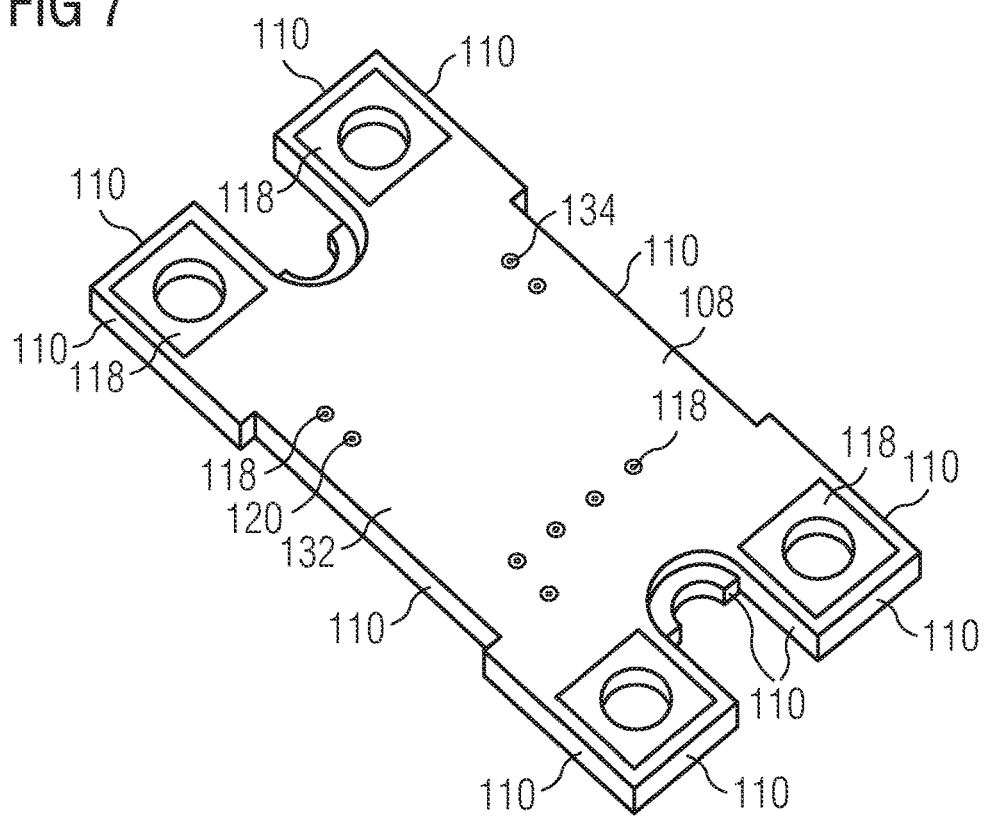

Referring to FIG. 7, part of the carrier 102, the thermally conductive and electrically insulating bodies 104, the electronic chips 106, the components 114, the internal electrically conductive contact structures 116 and part of the external electrically conductive contact structures 118 are encapsulated by an encapsulant 108. In the shown embodiment, the encapsulant 108 is a mold compound. The encapsulation is carried out so that the encapsulant 108 forms the entire lateral sidewalls 110 of the module 100.

As mentioned, the external electrically conductive contact structure 118 are only partially encapsulated so as to extend beyond the encapsulant 108, in the shown embodiment exclusively at an upper main surface of the module 100. This can be accomplished by foil molding, i.e. by covering the portions of the external electrically conductive contact structures 118, which shall be later exposed, with adhesive foils temporarily during the encapsulation process. Thereafter, the foils may be removed so as to expose the external electrically conductive contact structures 118 for establishing an electric contact with an electronic environment and without disturbing dielectric mold compound thereon. Thus, in order to prevent coverage of the external electrically conductive contact structures 118 with encapsulant material 108 during encapsulation, it is possible to cover these elements 118 during molding with foils. A corresponding foil may be put on part of these elements 118 and can be clamped between external electrically conductive contact structures 118 on the one hand and an upper encapsulation tool (such as an upper mold tool) on the other hand.

Also the carrier 102 extends up to a surface of the module 100, more specifically forms the majority of the lower main surface 130 thereof for efficient heat removal. The encapsulant 108 forms the major portion of an opposing other main surface 132 of the module 100. Also the circumferential side edge of the module 100 is substantially formed by the encapsulant 108. In the molded state shown in FIG. 7, the redistribution structure 112 extends fully inside the encapsulant 108.

FIG. 7 therefore shows how the encapsulant 108, here embodied as mold compound, is applied to the intermediate product shown in FIG. 6 and defines a significant part of the outline of the module 100 under manufacture. During molding, the exterior surface of the module 100 may be defined, the electronic chips 108 as well as the components 114 are covered, and void regions between carrier 102 and redistribution structure 112 may be filled.

FIG. 8 shows a three-dimensional view of a power module 100 manufactured by executing the method described referring to FIG. 1 to FIG. 7 according to an exemplary embodiment.

Concluding, the shown power module 100 comprises plate-type carrier 102 covered with spatially strictly limited plate-type thermally conductive and electrically insulating bodies 104. The carrier 102 and the bodies 104 are, in turn, covered by a single layer or a multilayer redistribution structure 112. One or more semiconductor power chips 106, optionally accompanied by one or more further components 114, are mounted on the redistribution structure 112 and directly vertically above the thermally conductive and electrically insulating bodies 104. The mold-type encapsulant 108 encapsulates part of the carrier 102, the thermally conductive and electrically insulating bodies 104 and the semiconductor power chip 106 as well as the further components 116. Both a majority of an upper main surface 132 and an entire sidewall 110 of the module 100 are delimited by the encapsulant 108, while a lower main surface 130 is predominantly defined by the carrier 102 and partially by the encapsulant 108.

As can be taken from FIG. 8, the pins 122 may then be inserted into the hollow spaces 134 of the sleeves 120. This simplifies electrical connection between the so obtained module 100 and an electronic periphery.

Several power signals U, V, DC+, DC− and several control signals $G_1$, $G_2$, $G_3$, $G_4$, Sense applied to the various exterior electrically conductive contact structures 118 are indicated in FIG. 8.

FIG. 9 shows a cross-sectional view of a power module 100 according to an exemplary embodiment.

The cross-sectional view shown in FIG. 9 illustrates that the module 100 can be manufactured with an extremely compact design, i.e. a very small height. Moreover, the manufacturing process is very simple, since a majority of the outline of the module 100 is defined by the encapsulant 108 and the carrier 102. The thermally conductive and electrically insulating bodies 104 are limited to regions where they are absolutely necessary for heat removal and electric reliability. This measure also contributes to the simple manufacturing of the module 100.

Figure 10:
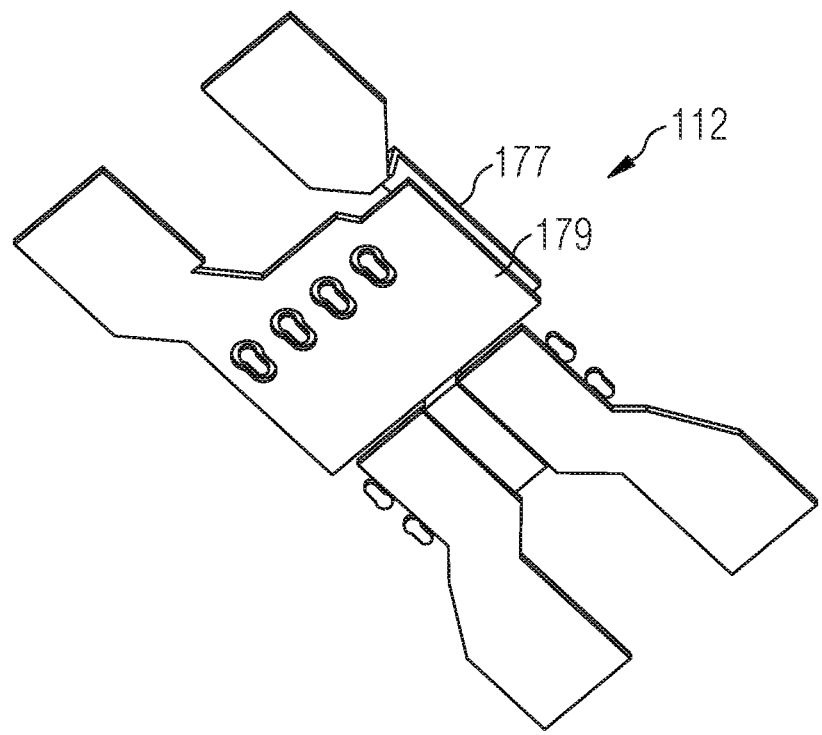
FIG. 10 shows a three-dimensional view of a redistribution structure composed of different vertically spaced layers of a module according to another exemplary embodiment.
Figure 11:
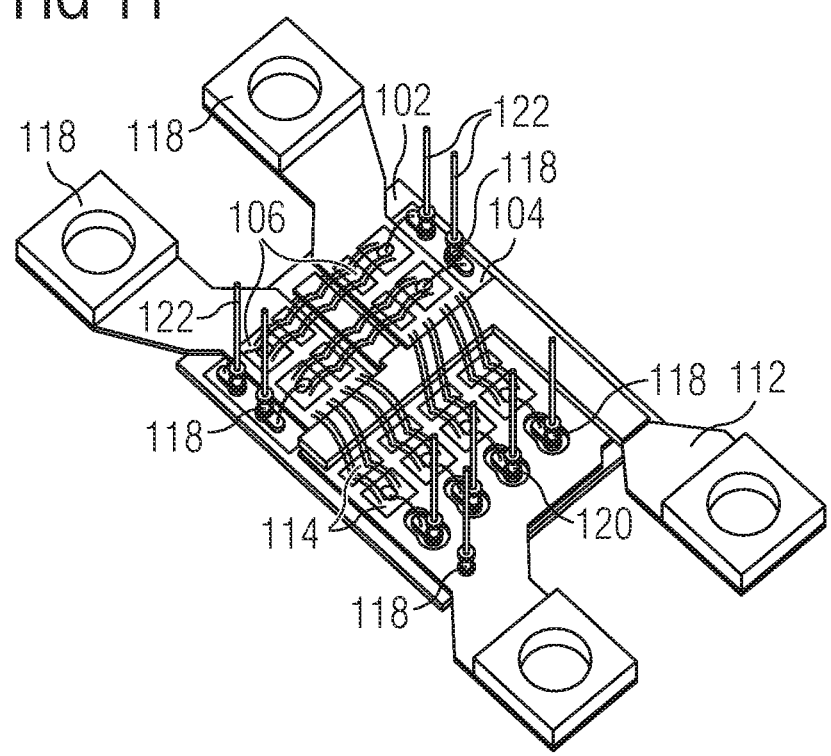
FIG. 11 shows a three-dimensional view of a preform of a module under manufacture according to the embodiment of FIG. 10 prior to encapsulation.

FIG. 10 shows a three-dimensional view of a redistribution structure 112 composed of different vertically spaced layers 177, 179 of a module 100 according to another exemplary embodiment. FIG. 11 shows a three-dimensional view of a preform of a module 100 under manufacture according to the embodiment of FIG. 10. FIG. 10 and FIG. 11 show an embodiment of a redistribution structure 112 which is partially formed in different layers 177, 179. By taking this measure, a low inductance of the obtained module 100 can be obtained.

In the embodiment according to FIG. 10 and FIG. 11, it is thus possible to configure the redistribution structure 112 as a multi-layer structure. This has a positive impact on the value of the inductance of the redistribution structure 112, which may be reduced by taking this measure. In this context, it is also possible to implement electrically insulating support elements as spacers (not shown) between the various layers 177, 179.

It should be noted that the term "comprising" does not exclude other elements or features and the "a" or "a" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, and composition of matter, means, methods and steps described in the specification. Accordingly, the appended claims are intended to include within their scope such processes, machines, manufacture, compositions of matter, means, methods, or steps.

What is claimed is:

1. A module, comprising:
a planar metal carrier plate having an upper main surface;
a thermally conductive and electrically insulating body mounted on only a part of the upper main surface of the carrier plate;
an electrically conductive redistribution structure mounted on top of the thermally conductive and electrically insulating body, wherein the redistribution structure is a patterned redistribution plate having redistribution plates that are all laterally spaced apart and not vertically overlapping;
an electronic chip mounted on the redistribution structure and above the thermally conductive and electrically insulating body;
an encapsulant encapsulating at least part of the carrier, at least part of the thermally conductive and electrically insulating body, at least part of the redistribution structure, and at least part of the electronic chip,
wherein the thermally conductive and electrically insulating body is smaller than the redistribution structure and the carrier, thereby forming a gap between the redistribution structure and the carrier, wherein the gap is filled with the encapsulant.

2. The module according to claim 1, wherein the encapsulant forms at least part of a lateral sidewall of the module.

3. The module according to claim 1, wherein at least 50% of an area of the upper main surface of the carrier facing the thermally conductive and electrically insulating body remains free of the thermally conductive and electrically insulating body.

4. The module according to claim 1, wherein the carrier forms part of an exterior surface of the module, in particular substantially forms one main surface of the module.

5. The module according to claim 1, wherein the encapsulant forms at least part of one main surface of the module.

6. The module according to claim 1, wherein the redistribution structure comprises at least two redistribution elements being vertically spaced.

7. The module according to claim 1, wherein the redistribution structure is substantially X-shaped with a central plate portion.

8. The module according to claim 1, wherein the thermally conductive and electrically insulating body is made of silicon nitride.

9. The module according to claim 1, comprising:
a further thermally conductive and electrically insulating body mounted on only another part of the main surface of the carrier; and
a component, in particular a further electronic chip, mounted on the redistribution structure and above the further thermally conductive and electrically insulating body.

10. The module according to claim 1, comprising at least one internal electrically conductive contact structure encapsulated by the encapsulant, in particular at least one of a bond wire and a bond ribbon, electrically connecting at least one pair of the group consisting of the electronic chip with the redistribution structure, and the electronic chip with the component.

11. The module according to claim 1, comprising at least one external electrically conductive contact structure extending beyond the encapsulant and electrically connecting the electronic chip with an electronic environment.

12. The module according to claim 11, wherein the at least one external electrically conductive contact structure comprises at least one electrically conductive sleeve having a hollow space configured for accommodating an electrically conductive pin.

13. The module according to claim 1, wherein the thermally conductive and electrically insulating body has a thermal conductivity of at least 20 W/mK, in particular of at least 50 W/mK, more particularly of at least 80 W/mK.

14. A module, comprising:
a planar metal carrier plate having an upper main surface;
a thermally conductive and electrically insulating body mounted on only a part of the upper main surface of the carrier plate;
an electrically conductive redistribution structure mounted on the thermally conductive and electrically insulating body, wherein the redistribution structure is a patterned redistribution plate having redistribution plates that are all laterally spaced apart and not vertically overlapping;
an electronic chip mounted on the redistribution structure and above the thermally conductive and electrically insulating body;
an encapsulant encapsulating at least part of the carrier, at least part of the thermally conductive and electrically insulating body, at least part of the redistribution structure, and at least part of the electronic chip,
wherein the thermally conductive and electrically insulating body is smaller than the redistribution structure and the carrier.

15. The module according to claim 14, wherein the redistribution structure comprises at least two redistribution elements being vertically spaced; at least one internal electrically conductive contact structure encapsulated by the encapsulant, in particular at least one of a bond wire and a bond ribbon, electrically connecting at least one pair of the group consisting of the electronic chip with the redistribution structure, and the electronic chip with the component; and at least one external electrically conductive contact structure extending beyond the encapsulant and electrically connecting the electronic chip with an electronic environment.

* * * * *